United States Patent
Tsuchiaki

(10) Patent No.: US 6,815,298 B2
(45) Date of Patent: Nov. 9, 2004

(54) METHOD OF FORMING A SEMICONDUCTOR DEVICE INCLUDING FORMING AN AMORPHOUS SILICON LAYER OVER AND REACTING WITH A SILICIDE LAYER

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/256,164

(22) Filed: Sep. 27, 2002

(65) Prior Publication Data

US 2003/0062575 A1 Apr. 3, 2003

(30) Foreign Application Priority Data

Sep. 28, 2001 (JP) ........................................ 2001-303931

(51) Int. Cl.[7] ........................ H01L 21/336; H01L 21/44
(52) U.S. Cl. ........................ 438/299; 438/303; 438/682; 438/683
(58) Field of Search ................................ 438/299, 303, 438/682, 683

(56) References Cited

U.S. PATENT DOCUMENTS

| | | | | | |
|---|---|---|---|---|---|
| 5,759,899 | A | * | 6/1998 | Saito | 438/303 |
| 5,920,774 | A | * | 7/1999 | Wu | 438/224 |
| 6,165,903 | A | * | 12/2000 | Besser et al. | 438/682 |
| 2002/0031909 | A1 | * | 3/2002 | Cabral et al. | 438/655 |

FOREIGN PATENT DOCUMENTS

JP    2698585    9/1997

OTHER PUBLICATIONS

Stanley Wolf Ph.D. in Silicon Processing for the VLSI Era, vol. 2: Process Integration, Lattice Press, 1990, pp. 354–356.*

M. Tsuchiaki, et al., Extended Abstracts of the 2001 International Conference on Solid State Devices and Materials, pp. 216–217, "Intrinsic Junction Leakage by Co In–Diffusion During $CoSi_2$ Formation Characterized with Damage Free n+ /p Silicon Diodes", 2001.

Masakatsu Tsuchiaki, et al., "Intrinsic Junction Leakage Generated by Cobalt In–Diffusion during $CoSi_2$ Formation", Jpn. J. Appl. Phys., vol. 41, pp. 2437–2444, Apr. 2002.

U.S. patent application Ser. No. 10/159,118, filed Jun. 3, 2002, pending.

* cited by examiner

Primary Examiner—W. David Coleman
Assistant Examiner—William M. Brewster
(74) Attorney, Agent, or Firm—Oblon, Spivak, McClelland, Maier & Neustadt, P.C.

(57) ABSTRACT

A semiconductor device has a SALICIDE structure with low leakage currents, while maintaining shallow source and drain regions. A method of manufacturing the semiconductor device includes forming source and drain regions in a first semiconductor layer, the source region and the drain region being separated from each other forming a gate insulating film between the source region and the drain region on the first semiconductor layer and a gate electrode on the gate insulating film, forming a metal silicide layer having a first compound phase on the source region, the drain region and the gate electrode, forming a second semiconductor layer on the metal silicide layer having the first compound phase where the second semiconductor layer is adapted to react with the metal silicide layer, and forming a metal silicide layer having a second compound phase by causing the second semiconductor layer and the metal silicide layer having the first compound phase to selectively react with each other.

7 Claims, 8 Drawing Sheets

METHOD OF FORMING A SEMICONDUCTOR DEVICE INCLUDING FORMING AN AMORPHOUS SILICON LAYER OVER AND REACTING WITH A SILICIDE LAYER

CROSS-REFERENCE TO RELATED APPLICATIONS

This application is based upon and claims the benefit of priority from the prior Japanese Patent Application No. 2001-303931, filed on Sep. 28, 2001; the entire contents of which are incorporated herein by reference.

BACKGROUND OF THE INVENTION

1. Field of the Invention

This invention relates to a method of manufacturing a semiconductor device and also to a semiconductor device.

2. Description of the Related Art

The demand for miniaturization of individual semiconductor devices and large-scale integration of such devices has been and still is increasing to realize high-speed operation and also to attain versatile functionality of semiconductor circuits. However, for successful shrinkage of the device dimensions, various related difficulties are to be overcome. Such difficulties will be understood when considering miniaturization of a MOSFET which comprises an integral part of a semiconductor circuit.

For instance, with reduction of a channel length (i.e., length of the gate electrode) of the MOSFET, its threshold voltage decreases (i.e., short channel effect). If the threshold voltage decreases from an intended value, the MOSFET will operate in an unexpected way and may impair the entire function of the circuit. Moreover, the extent of the voltage drop depends sharply on the physical length of the gate electrode. It entails that, for fabrication of small dimension MOSFET's, a minor variation of the gate length originated from a process fluctuation of gate electrode formation will result in a large deviation of the threshold voltage. This short channel effect becomes especially problematic when a circuit requires a large number of MOSFET's with an identical function (such as dynamic random memories, DRAM). The strict requirements for the functional uniformity of the individual device can be satisfied only through an extremely tight quality control of the manufacturing processes, thus restricting the manufacturability of integrated circuits such as DRAMs.

The short channel effect is caused when distortion of electric field in the vicinity of the source and drain electrodes comes to influence the electric field around the center of the channel with the reduction of the channel length. The influence can be avoided by bringing the pn junction formed by the source and the drain closer to the semiconductor surface (i.e., by making the source and drain shallower). However, when the source and drain are simply made shallow, the electric resistance of the source and electrodes increases and obstructs high speed transmission of signals through the device.

To counter this problem, it is a common practice that upper portions of the source and drain regions are chemically combined with a metal to produce a compound (silicidation) which shows significantly lower resistivity than silicon. Metals that can be used for silicidation include Co, Ti and Ni, of which Co is most suitable. This is because it does not show any rise in the electric resistance when it is formed on thin lines (i.e., lack of narrow line effects) and is stable at high temperature. These preferable characteristics of the Co silicidation stand LSI fabrication in good stead.

However, during the silicidation reaction, metal atoms quickly diffuse into the silicon substrate and eventually penetrate the junctions forming the source and drain electrodes if the source and drain are made shallow. When the metal atoms migrate beyond the junctions of the source and drain, they generate leakage currents through the junctions. And source and drain electrodes stop functioning properly.

In fact, the metal atoms diffuse very quickly. In the case of Co, the Co atoms reach a depth of 150 nm even during the silicidation process at 800° C. for 30 seconds. FIG. 6 shows leakage levels of n+/p junctions with 35 nm-thick $CoSi_2$ layer thereon as a function of the junction depth (the depth includes the 35 nm of the silicide layer thickness). For reference, leakage levels of silicide-less junctions are also plotted. From FIG. 6, a sizable increase of the leakage current is already evidenced at the depth of 150 nm from the surface, which is by far deeper than the bottom of the silicide film. The increase is due to a rapid migration of the Co atoms into the silicon substrate. In general, rapid diffusion of metal atoms proceeds inevitably along the interfaces between metal and silicon during the silicidation reaction. The metal atoms that have penetrated deep into the silicon substrate form generation-recombination centers in the band gap of silicon and mediate junction leakage currents. If such gap states are formed in the source/drain junctions, leak currents flow through the source/drain electrodes towards the silicon substrate. Then, the function of the MOSFET is impaired. When the MOSFET constitutes a part of a DRAM's memory cell, the data stored in the cell will be lost and the semiconductor circuit will no longer operate properly.

To alleviate this problem, a technique (known as elevated source/drain method) for selective formation of additional silicon layers on the source and drain regions are developed. With this technique, the surf aces of the semiconductor substrate, where the source and drain electrodes are to be formed, are raised above the original semiconductor surface (where the channel is formed). Then, over the additionally elevated surfaces, pn junction formation for the source and drain regions and the silicidation process are performed. The junctions formed in this way can be located at a shallow position relative to the original surface of the semiconductor substrate, while maintaining a deep position as viewed from the newly elevated surfaces of source and drain regions. Hence, a sufficient thickness of the source/drain electrodes can be secured.

Such a selective elevation of source and drain surfaces can be realized by using a technique known as selective epitaxial growth. However, for this technique to be successfully applied to actual device fabrication, the final position of the resulting pn junction of the source/drain regions needs to be precisely positioned at the original semiconductor surface (where the channel is formed) or be located slightly below it. This is because drivability of the MOSFET is remarkably reduced if the junction is located above the original surface (the channel interface), whereas a severe short channel effect appears if the junctions are located far below the original surface.

However, the epitaxial growth is very sensitive to the state of the substrate surface on which the selective silicon growth is to be achieved. For instance, the thickness of the silicon film grown on the substrate varies depending on the roughness or crystalline structure of the substrate surface. Also, the quality of the grown film (i.e., the presence/absence of the crystalline defects in the film) depends on the surface condition of the substrate. Thus, for example, incomplete removal of a native oxide on the substrate surface or residual process-damage incurred during gate electrode formation may well result in severe variation in the film thickness between individual devices for which elevation of source and drain regions is attempted.

If the thickness of the additionally formed silicon films is not uniform, it is very difficult to place pn junctions of source/drain regions near the original surface of the semi-conductor substrate (where the channel is formed) in a controlled manner. Impurities for the source/drain formation are introduced through the surfaces of the additionally formed silicon films. Non-uniform thickness of the additionally formed silicon films makes the relative distances from their surfaces to the original semiconductor surface (i.e., channel surface) indefinite. Thus, the junctions cannot be accurately placed at the original semiconductor surface whose location is indefinite relative to the surfaces from where the impurities are introduced.

Likewise, if the quality of the grown silicon films differs from a device to a device, it becomes difficult to place the pn junctions precisely at the targeted position near the original semiconductor surface. This is because, the presence of crystal defects in the film (i.e., the film quality) greatly influences the speed of impurity diffusion in the film (e.g., transient enhanced diffusion). It entails that a predetermined thermal diffusion of the impurity for the junction formation could result in non-uniform junction depth due to unex-pected impurity diffusion caused by the crystal defects in the film.

Similarly, the diffusion of metal atoms during silicidation is also subject to the quality of the grown silicon films. Thus, even when the source and drain regions are raised by the additional silicon films, if their thickness and quality are non-uniform, metal atoms can easily diffuse and penetrate the junctions at points where the film thickness is thin or the film quality is low. It follows that the non-uniformity of the film thickness and quality limits the effectiveness of the epitaxial growth to counter the leakage generation by the silicidation process.

Furthermore, the metal diffusion in a silicon crystal is very fast itself. Accordingly, in order to block the metal diffusion effectively, the additional silicon layer must be very thick (i.e., thicker than 150 nm). However, due to above-describe reasons, it is almost impossible to selectively and uniformly grow silicon layers as thick as 150 nm on the individual source and drain regions.

Moreover, the height of the source and drain regions, raised by 150 nm, almost equals the height of the gate electrodes. The lack of the height-difference makes it difficult to ensure electrical isolation between gate electrodes and source/drain regions when silicidation process is applied to these electrodes and regions simultaneously (SALICIDE (self-align-silicide) process).

In addition, a selectively grown silicon film tends to become thinner in a region adjacent to a gate electrode (which is an intrinsic characteristic of the epitaxial growth). Prior to the silicidation process, the shortest distance between a metal film deposited on the device surface and the source/drain junction is determined at this portion. Hence it is this thinner region that could eventually limit the film's ability to block the metal diffusion regardless of the thickness of the additional silicon films grown elsewhere.

As described above, in manufacturing of a small-dimension MOSFET device, a silicide layer must be formed on source and drain regions to secure low electrical resistance of the regions while keeping a shallow junction position of the source and drain regions. However, fast metal diffusion during the silicide reaction easily penetrates the shallow junctions and induces leakage. To counter the leakage generation, source and drain regions could be elevated by selective epitaxial growth. Even with this elevation, the fast metal diffusion requires that a silicon layer must be selectively grown to a thickness almost equal to the height of a gate electrode. Unfortunately, however, it is very difficult to form such a thick film having a uniform thickness and quality with this method.

Thus, it is the object of the present invention to provide a semiconductor device that has a SALICIDE structure with low leakage currents and a source/drain height lower than the gate electrode, while maintaining shallow source and drain regions, without the above identified problems of conventional methods. It is also the object of the present invention to provide a method of manufacturing such a semiconductor device.

BRIEF SUMMARY OF THE INVENTION

In an aspect of the invention, the above object is achieved by providing a method of manufacturing a semiconductor device comprising:

forming source and drain regions in a first semiconductor layer, the source region and the drain region being separated from each other, a gate insulating film between the source region and the drain region on the first semiconductor layer and a gate electrode on the gate insulating film;

forming a metal silicide layer showing a first compound phase on the source region, the drain region and the gate electrode;

forming a second semiconductor layer on the metal silicide layer showing the first compound phase, the second semiconductor layer being adapted to react with the metal silicide layer; and forming a metal silicide layer showing a second compound phase by causing the second semiconductor layer and the metal silicide layer showing the first compound phase to selectively react with each other.

Preferably, the step of forming a metal silicide layer showing the second compound phase is conducted under a condition where the reaction of the second semiconductor and the metal silicide showing the first compound phase has preference to the reaction of the first semiconductor and the metal silicide showing the first compound phase.

Preferably, the metal silicide is cobalt silicide and the metal silicide showing the first compound phase is CoSi, while the metal silicide showing the second compound phase is $CoSi_2$.

Preferably, the first semiconductor layer is a single crystal silicon layer and the second semiconductor layer is an amorphous silicon layer.

Preferably, the step of forming a metal silicide layer showing the second compound phase is a heat treatment step conducted at temperature between 550° C. and 650° C.

In another aspect of the invention, there is provided a semiconductor device comprising:

source and drain regions formed in a single crystal silicon layer and separated from each other;

a gate insulating film formed between the source region and the drain region on the single crystal silicon layer;

a gate electrode formed on the gate insulating film; and a metal silicide layer formed on the source region and the drain region;

the concentration of metal atoms in the source region and the drain region being not higher than $1 \times 10^{19}$ cm$^{-3}$;

the depth of the pn junction formed by the drain region and the single crystal silicon layer being not greater than 100 nm.

Preferably, the metal silicide is cobalt silicide and the metal atoms are cobalt atoms, not less than 17/35 of the film thickness of the metal silicide layer protruding over the single crystal silicon layer.

Preferably, the semiconductor device further comprises a silicon layer arranged on the metal silicide layer and electrically connected to the source region and the drain region.

This invention is based on the finding of the inventors of the present invention as described below.

For LSI manufacturing, compound formation between Si and Co (silicidation reaction) is commonly performed by applying a Co layer on a silicon substrate and then subjecting them to a heat treatment. At low temperature, CoSi phase is formed first. An annealing at a higher temperature promotes phase transition from CoSi to CoSi$_2$. The CoSi$_2$ phase shows a lower electric resistivity than that of CoSi and thus is used as a final form of the silicide layer for the LSI application.

As described in FIG. 6, it is an inherent nature of CoSi$_2$ formation that Co atoms outburst into the silicon substrate during the silicidation reaction and then generate the leakage current. The inventors of the present invention further tried to identify the exact moment of the Co outburst during the silicidation reaction. FIG. 1 shows depth profiles of Co atom in the silicon substrate after the formation of the CoSi phase and after the transition to the CoSi$_2$ phase measured by SIMS from the backside of the substrate (i.e., the profiles are free from knock-on effects). Evidently, Co outbursts at the time of the phase transition into CoSi$_2$. And, notably, formation of CoSi phase alone does not induce sizable Co migration into the silicon substrate.

Moreover, the inventors of the present invention found that the temperature of the phase transition from CoSi to CoSi$_2$ strongly depends on the physical state of silicon substrate. FIG. 2 plots sheet resistance of silicide layers as a function of temperature of a rapid thermal annealing (RTA) applied after CoSi formation on A: a single crystal silicon and B: an amorphous silicon layer produced by As implantation of $1 \times 10^{15}$ cm$^{-2}$ dosage. The RTA was performed with a ramping rate of 100° C./sec in a nitrogen atmosphere. Obviously, a sharp drop of the resistance signals a phase transition from a high-resistivity CoSi phase to a low-resistivity CoSi$_2$ phase. Regarding the silicidation on the single crystal silicon, the phase transition occurs in a temperature range between 650° C. and 700° C. On the other hand, on the amorphous silicon, the phase transitional ready progresses at around 550° C.

On the basis of the above observations, the inventors of the present invention came to find a method of manufacturing a semiconductor device, which will be described below.

Firstly, as shown in FIG. 3A, a single crystal silicon substrate 1 operating as first semiconductor layer and having source and drain regions 2, 3 formed therein and separated from each other, a gate insulating film 4 formed between the source region 2 and the drain region 3 on the single crystal silicon layer 1 and a gate electrode 5 formed on the gate insulating film is prepared. In FIG. 3A, reference numeral 6 denotes an extended source region and reference numeral 7 denotes an extended drain region, whereas reference numeral 8 denotes a device isolating insulating layer and reference numeral 10 denotes the sidewalls of the gate electrode. Then, a metal silicide (CoSi) layer (not shown) showing a first compound phase is formed on the source region 2, the drain region 3 and the gate electrode 5. More specifically, a Co layer (not shown) is formed on the source region 2, the drain region 3 and the gate electrode 4 and subjected to a first heat treatment process to produce layers 501, 502 and 503 showing a CoSi phase. The first heat treatment condition for producing the CoSi phase is that of suitably conducting a rapid thermal annealing process in a temperature range between 450° C. and 500° C. Any possible production of a CoSi$_2$ phase should be effectively suppressed under this condition. It is possible to form CoSi layers 501, 502, 503 respectively on the regions 2, 5, 3 in a self aligning manner by wet etching the remaining Co that is left unreacted. Thereafter, an amorphous silicon layer 600 is formed as second semiconductor layer on the metal silicide layers showing the first compound phase. The amorphous silicon layer 600 is adapted to react with the metal silicide layer.

Subsequently, as shown in FIG. 3B, the semiconductor layer 600 and the metal silicide layer showing the first compound phase are made to selectively react with each other to form metal silicide layers 511, 512, 513 showing a second compound phase respectively on the source region 2, the gate electrode 5 and the drain region 3. When a second heat treatment is conducted after depositing the amorphous silicon layer 600, theoretically, a reaction of phase transition to CoSi$_2$ could take place at the interface between the amorphous silicon layer 600 and the CoSi layers 501, 502, 503, as well as at the interface between CoSi layers 501, 502, 503 and the crystal silicon substrate below. However, if the second heat treatment is conducted at temperature between 550° C. and 650° C., as shown in the FIG. 2, it is possible to make the reaction of phase transition selectively progress between the amorphous silicon layer and upper zones of the CoSi layers 501, 502, 503, while phase transition to CoSi$_2$ phase does not progress between the single crystal silicon and lower zones of the CoSi layers 501, 502, 503. During this heat treatment, Co atoms migrate from the CoSi layers 501, 502, 503 only into the amorphous layer above and react with the silicon atoms to form CoSi$_2$ layers. If the second heat treatment is conducted in this way, the reaction of phase transition does not proceed between CoSi layers 501, 502, 503 and the crystal silicon substrate below.

Thus, as shown in the FIG. 1, no metal atoms get to the source/drain junction interface formed in the substrate, hence generating no leakage.

Moreover, because no reaction proceeds between CoSi layers and the crystal silicon substrate below, no silicon is consumed during the heat treatment and CoSi$_2$ layers grow one-sidedly into the upper zone of the amorphous silicon layer. Therefore, the CoSi$_2$ layers come to be raised partly over the original surface (the channel forming surface) of the silicon substrate, providing an effect similar to the one obtained with an elevated source/drain structure. Since CoSi$_2$ layers can be formed with a uniform film thickness and raised over the original surface of the silicon substrate, the distance from the bottom of the CoSi$_2$ layers to the source/drain junctions increases. The increased distance strongly suppresses possible junction leakage even further together with the above-explained restrained diffusion of Co atoms.

Additionally, by forming CoSi layers in a self-aligning manner, depositing an amorphous silicon layer thereon and conducting the second heat treatment in this way, the CoSi$_2$ layers can be obtained also in a self-aligning manner over the source region 2, the drain region 3 and the gate electrode 5.

Consequently, by removing the remaining amorphous silicon layer, it is now possible to obtain a SALICIDE type MOSFET having an elevated source/drain structure, where diffusion of Co atoms into the substrate is suppressed in a self-aligning manner.

Otherwise, by keeping the remaining amorphous layer in a way that it maintains an electrical contact with extended source/drain region, a channel current can be made to flow from/into the silicide layer through both of the upper and lower interfaces. Then, the contact resistance between the $CoSi_2$ layers and the source/drain regions can be reduced to about a half.

Furthermore, with a manufacturing method according to the invention, the depth of the extended source/drain regions can be determined freely without concerns over the leakage current that may otherwise occur due to the silicidation. It provides an extra latitude in the device designing to prevent the short channel effect and enhance the controllability of the threshold voltage.

Besides, the length of the gate sidewalls (and hence the length of the extended source/drain regions) can be held to 100 nm or less so as to improve the device drivability because the leakage-free nature of the present manufacturing method removes a requirement for thick sidewalls to prevent the leakage induced by the silicidation.

In terms of the gate electrode, since metal atoms are prevented from diffusing into the polycrystalline silicon of the gate electrode, they no longer reach and degrade the gate insulator below. Therefore, the height of the gate electrode can be minimized to a great advantage to the subsequent lithography and planarization steps Adding to the above benefits, since the $CoSi_2$ layers grow freely into the upper amorphous silicon layer, any volumetric change induced by the silicidation and consequent generation of mechanical stress can be effectively avoided to eliminate any additional cause of producing leakage from the junction.

It should be noted here, with a manufacturing method according to the invention, the concentration of metal atoms in the source region and the drain region is held to $1 \times 10^{-19}$ $cm^{-3}$ or less and the depth of pn junction formed by the source region or the drain region and the single crystal silicon layer can be made to be not more than 100 nm. Thus, the short channel effect is prevented and the controllability of the threshold voltage is enhanced.

In terms of the intrinsic properties of the silicidation, if 10 nm-thick Co is deposited on the silicon substrate in the first heat treatment step of the manufacturing method according to the invention, 20 nm-thick CoSi is formed, of which about 18 nm of the CoSi layer is embedded into the silicon substrate and about 2 nm protrudes over the surface of the silicon substrate. If an amorphous silicon layer is additionally deposited thereon and subjected to the second heat treatment step, the CoSi layer consumes the silicon atoms above and transforms into $CoSi_2$. As a result, $CoSi_2$ encroaches on the upper amorphous silicon layer and about 17 nm grows above the original silicon substrate. On the other hand, an about 18 nm-thick $CoSi_2$ is remains as before below the original silicon substrate. Thus, of the resulting 35 nm-thick $CoSi_2$ layer formed by the manufacturing method according to the present invention, 17 nm or more is elevated over the surface of the original silicon substrate. In other words, the metal silicide formed on the silicon substrate is raised by 17/35 or more of the entire thickness. Its exact value is determined by the physical properties of silicon.

BRIEF DESCRIPTION OF THE DRAWINGS

FIG. 3A is a schematic cross sectional view before the heat treatment and FIG. 3B is a schematic cross sectional view after the heat treatment.

DETAILED DESCRIPTION OF THE INVENTION

Now, the present invention will be described by referring to the accompanying drawings that illustrate preferred embodiments of the invention. However, the present invention is by no means limited to the described embodiments, which may be altered or modified in various different ways.

(Embodiment 1)

This embodiment will be described in terms of the steps of manufacturing a semiconductor device having a silicide type elevated source/drain MOSFET structure, in which diffusion of Co atoms into the substrate is suppressed.

Figure 1:
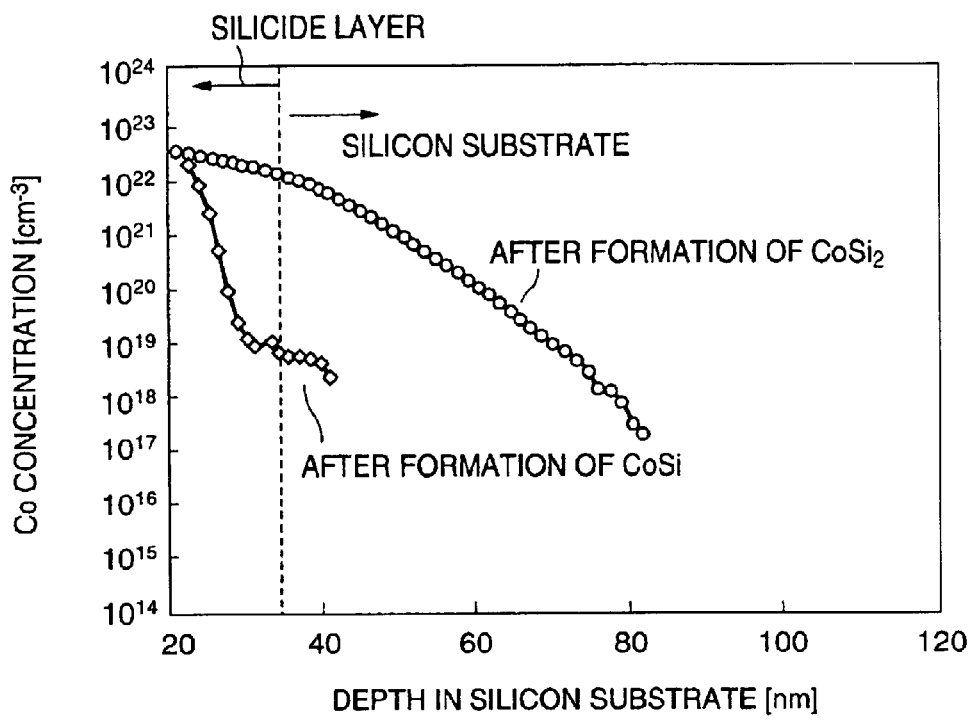
FIG. 1 shows a graph illustrating depth profiles of Co atom in the silicon substrate after the formation of the CoSi phase and after the transition to the $CoSi_2$ phase measured by SIMS from the backside of the substrate (i.e., the profiles are free from knock-on effects).
Figure 2:
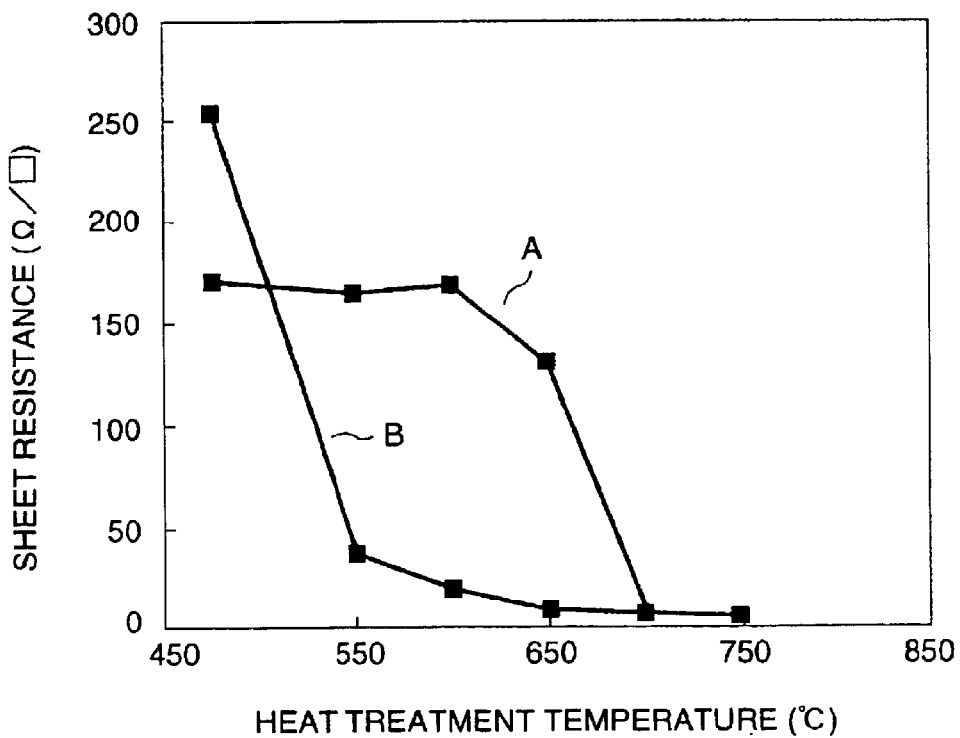
FIG. 2 a graph plotting sheet resistance of silicide layers as a function of temperature of a rapid thermal annealing (RTA) applied after CoSi formation on A: a single crystal silicon and B: an amorphous silicon layer produced by As implantation of $1 \times 10^{15}$ $cm^{-2}$ dosage.
Figure 3A:
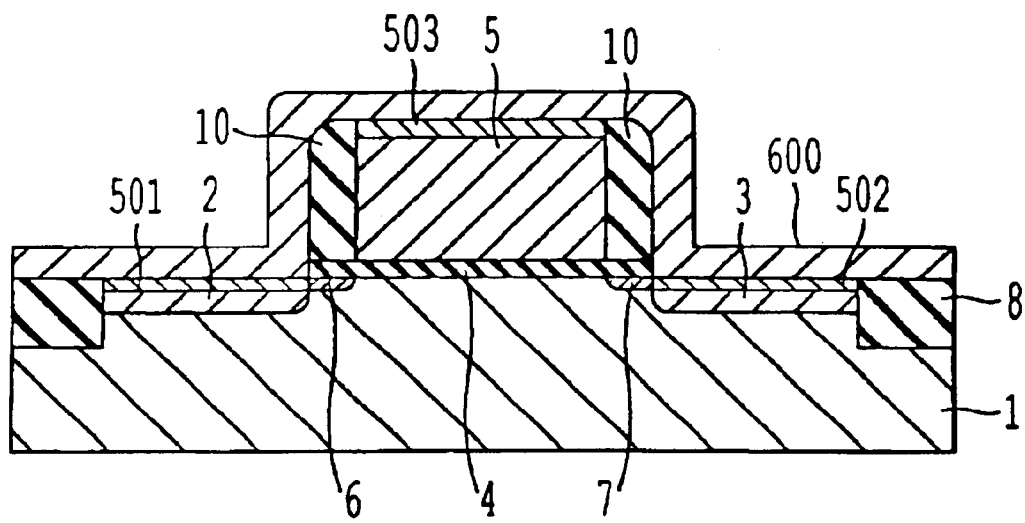
FIGS. 3A and 3B are schematic cross-sectional views of a MOSFET being produced by a manufacturing method according to the invention, where diffusion of Co atoms into the single crystal silicon substrate is suppressed by conducting a heat treatment so as to make the reaction of transition to a $CoSi_2$ phase selectively progress only between an upper zone of the amorphous silicon layer.
Figure 3B:
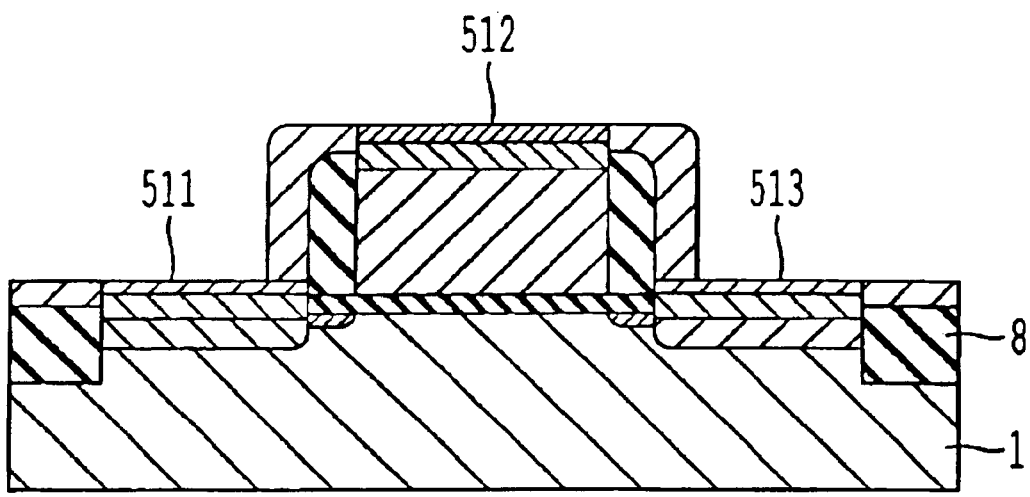
Figure 4A:
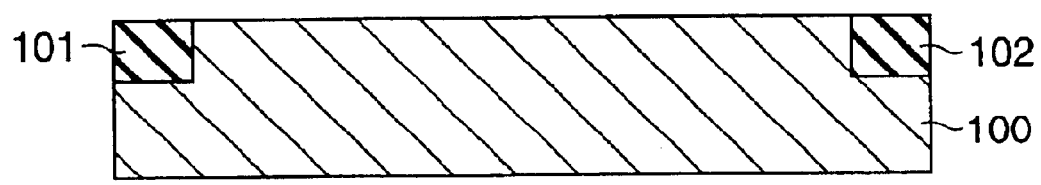
FIGS. 4A through 4I are schematic cross sectional views of the first embodiment of the invention, which is a MOSFET, in different manufacturing steps.

Referring to FIG. 4A, shallow trenches 101, 102 are formed on the surface of a single crystal silicon semiconductor substrate 100 by means of lithography and RIE. Subsequently, the surface of the substrate is covered by an insulating material such as silicon oxide film by means of CVD so as to fill up the trenches with the insulating substance. Then, the surface is planarized by CMP (chemical-mechanical-polishing) and device isolation regions are produced in the respective trenches.

Figure 4B:
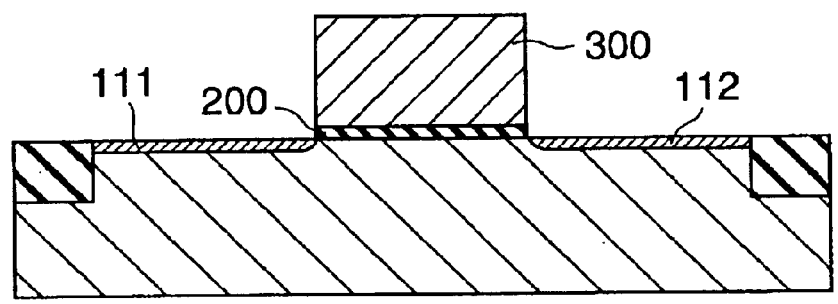

Thereafter, as shown in FIG. 4B, a gate insulating film 200 is formed to a thickness of 50 angstroms on the planarized surface of the substrate by thermal oxidation. Subsequently, a 2,000-angstroms-thick gate-electrode-forming material 300, which is polysilicon, is deposited on the insulating film by CVD. After forming a photo resist mask by lithography, a subsequent RIE process removes the gate material and etches the underlying insulating film outside the resist mask, so as to leave the gate electrode 300 and expose source/drain-forming regions at the both sides of the gate electrode. Thereafter, shallow diffusion regions are formed at the both sides of the gate electrode as source/drain extended regions 111, 112 by introducing the opposite type of impurity to the substrate using the gate electrode as a mask.

Figure 4C:
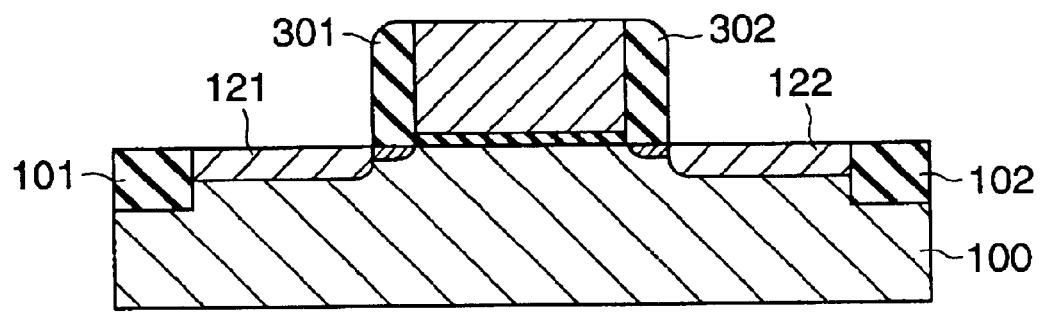

Then, as shown in FIG. 4C, a silicon nitride film is conformably deposited to a thickness of 200 angstroms by CVD. Subsequently, the silicon nitride film is subjected to anisotropic etching such as RIE so as to leave it only on the both sides of the gate electrode 300. As a result, gate sidewalls 301, 302 are produced. Thereafter, deeper diffusion regions are formed at the outer sides of the gate sidewalls as source/drain regions 121, 122 by introducing the opposite type of impurity to the substrate using the gate electrode and the sidewalls as a mask.

Figure 4D:
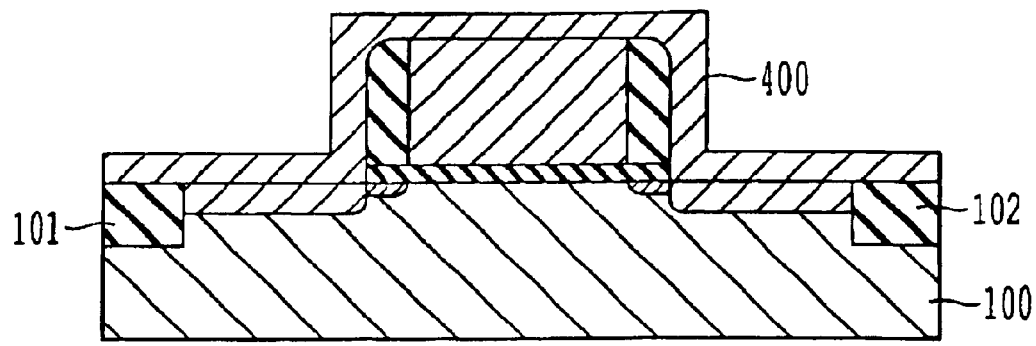

Subsequently, as shown in FIG. 4D, a Co layer 400 is formed typically to a thickness of 10 nm on the entire surface of the semiconductor substrate by sputtering or some other appropriate technique. If necessary, a metal substance such as Ti or TiN may be deposited further thereon as a cap layer.

Figure 4E:
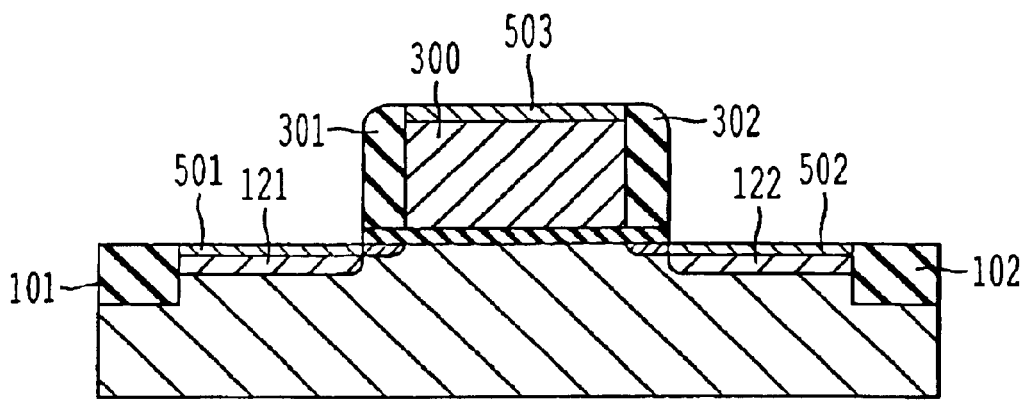

Then, as shown in FIG. 4E, the semiconductor substrate is subjected to a rapid thermal annealing process at 450° C. for 30 seconds in a nitrogen atmosphere so as to cause silicidation reaction selectively between the Co layer 400 and the underlying silicon regions that are in direct contact with Co. As a result, a CoSi region 501 is formed on the source region 121 and another CoSi region 503 is formed on the gate electrode 300, while still another CoSi region 502 is formed on the drain region 122. It should be noted that no $CoSi_2$ is produced by this heat treatment. In other words, no Co atoms diffuse into the source region 121, the gate electrode 300 and the drain region 122 at this stage. The produced CoSi layers have a thickness of about 20 nm. The rapid thermal annealing process is preferably conducted in a temperature rage between 450° C. and 500° C. with a ramping rate of 50° C./sec or more so as to produce CoSi as a first compound phase and suppress the production of a $CoSi_2$ phase. Thereafter, unreacted Co on the sidewalls 301, 302 and the device isolation regions 101, 102 is removed selectively by immersing the above structure into a mixture of sulfuric acid and aqueous hydrogen peroxide solutions.

Figure 4F:
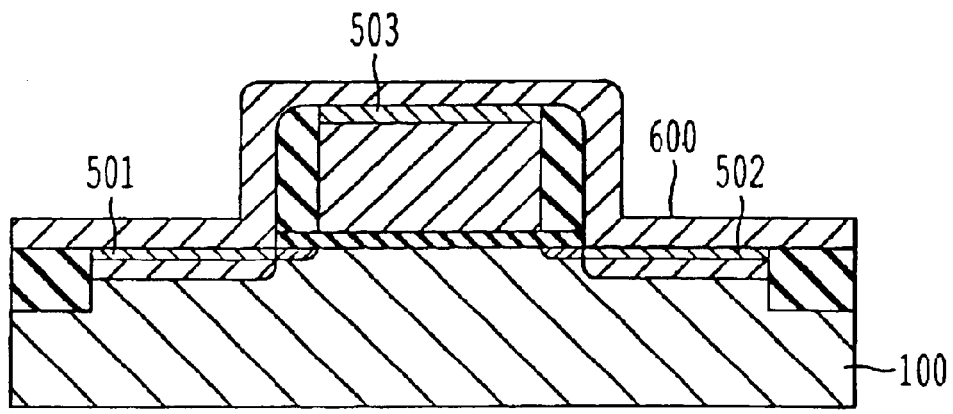

Subsequently, as shown in FIG. 4F, an amorphous silicon layer 600 is deposited on the entire surface of the substrate so as to cover the CoSi regions 501, 503, 502. Such an amorphous silicon layer 600 can be easily deposited, for example, by using $SiH_4$ gas under pressure of 0.2 Torr at temperature of 400° C. A gas such as $PH_3$, $AsH_3$ or $B_2H_6$ may be added to $SiH_4$ gas in order to make the amorphous silicon layer 600 conductive to the same conductive type of the source/drain. The surface of the CoSi regions 501, 503, 502 may be cleaned in advance to the deposition of the amorphous silicon, for example, by bombarding the surface with an Ar beam using an appropriate technique such as inverse sputtering in order to improve the reactivity of the surface. Optionally, an impurity such as As or some other appropriate element may be implanted into the amorphous silicon layer.

Figure 4G:
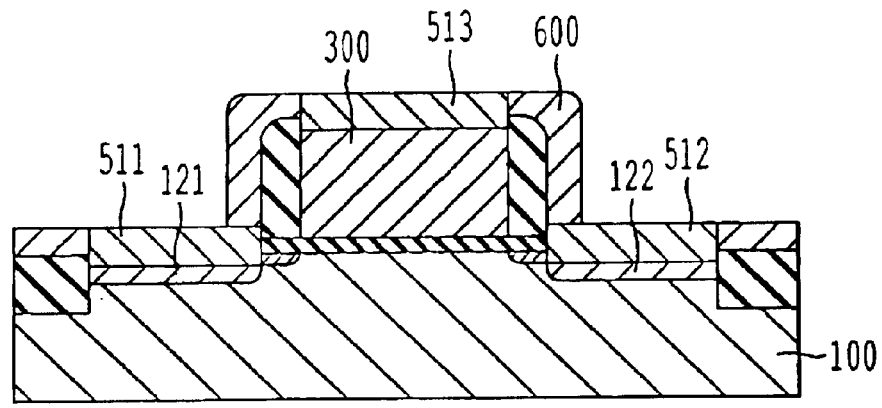

Then, as shown in FIG. 4G, the substrate is subjected to a rapid thermal annealing process at 600° C. for 30 seconds typically in a nitrogen atmosphere so as to cause phase transition from CoSi to $CoSi_2$. The phase transition proceeds selectively only in areas where the amorphous silicon layer 600 is in the direct contact with the CoSi regions 501, 503, 502. As a result of the heat treatment, the phase transition from CoSi to $CoSi_2$ proceeds in such a way that $CoSi_2$ grows only into the amorphous silicon layer 600. $CoSi_2$ regions 511, 513, 512 are formed on the source region 121, the gate electrode 300 and the drain region 122, respectively. The $CoSi_2$ layers 511, 512 protrude halfway over the main surface of the silicon substrate 100. On the other hand, Si atoms in the single crystal silicon substrate are not consumed at all by the reaction, thanks to the one-sided phase transition. Therefore, encroachment of the $CoSi_2$ regions 511, 513, 512 into the source region 121, the gate electrode 300 and the drain region 122, respectively, can be kept to a minimum. To be exact, the final film thickness of the $CoSi_2$ layer is 35 nm, of which 17 nm protrudes over the main surface of the silicon substrate. The CoSi regions 501, 503, 502 produced by the first heat treatment could contain a metallic phase such as a $Co_2Si$ phase. If such is the case, the $CoSi_2$ layers come to protrude over the main surface of the silicon substrate by more than 17 nm. In the FIG. 4G, the amorphous silicon layer 600 is exemplified to be completely consumed by the phase transition. However, it is clear that any amorphous silicon layer 600 thicker than that of the Si consumption by the phase transition will suffice for the present embodiment. Also, it should be noted here that, since phase transition from a CoSi phase to a $CoSi_2$ phase does not take place at the side of the single crystal silicon substrate 100, Co atoms are prevented from diffusing toward the source/drain junction interface. As a result, the distance from the bottom of the $CoSi_2$ layers to the source/drain junction interface can be made to be less than 100 nm.

Figure 4H:
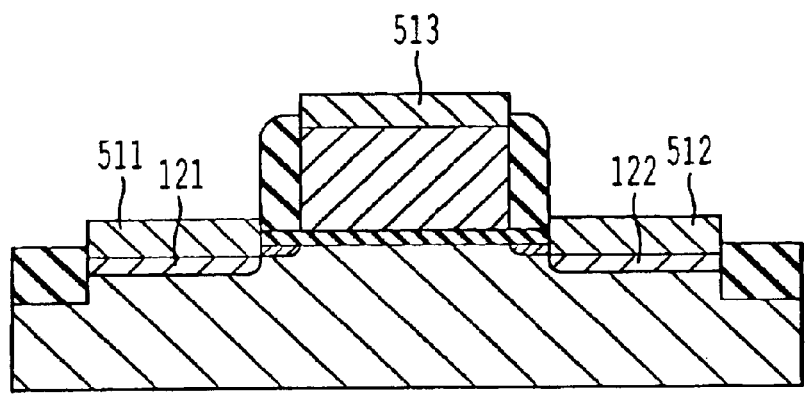

Thereafter, as shown in FIG. 4H, the remaining amorphous silicon layer on the substrate surface is selectively removed by isotropic etching such as CDE (chemical dry etching) while leaving the $CoSi_2$ layers. As a result of this step, amorphous silicon on the sidewalls of the gate electrode and the device isolating regions is disposed of and the $CoSi_2$ regions 511, 513, 512 are exposed.

Thus, a MOSFET with SALICIDE structure is realized. It has very shallow source/drain diffusion layers 121, 122, whereas the leakage from the junctions is strongly suppressed. The leakage suppression is attained by tailoring the phase transition to proceed only upward and therefore preventing the downward diffusion of metal atoms into the junctions. Moreover, the resulting silicide layers are raised about halfway over the source/drain, providing an effect similar to the one obtained with an elevated source/drain structure.

Figure 4I:
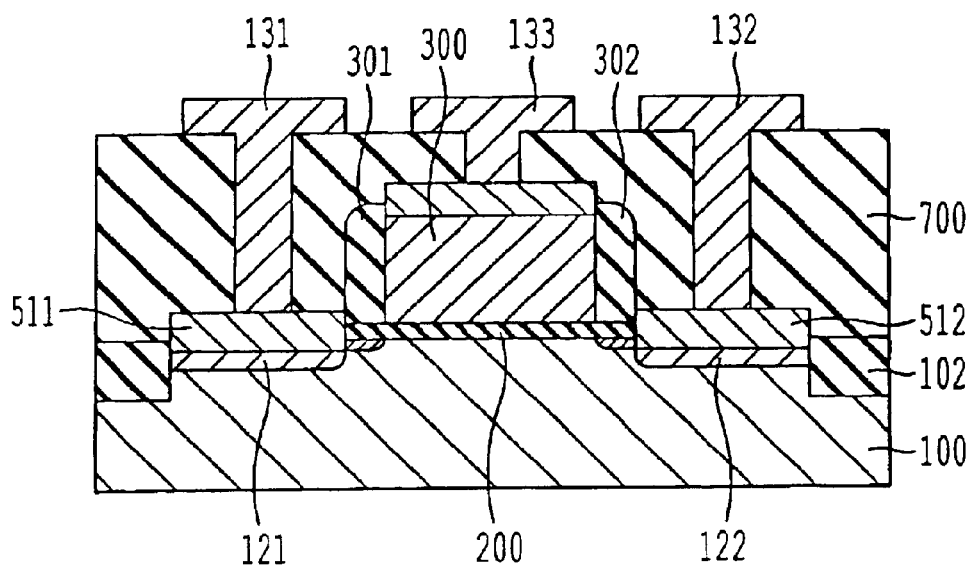

The process of manufacturing a semiconductor device is completed when interlayer insulating films 700 and contacts 131, 132, 133 connected respectively to the electrodes through the interlayer insulating films 700 are formed in a manner as shown in FIG. 4I.

(Embodiment 2)

Now, the second embodiment of the invention will be described below by referring to FIGS. 5A through 5D. Note that, in FIGS. 5A through 5D, the components same as or similar to those of the first embodiment are denoted respectively by the same reference symbols.

This embodiment will be described in terms of the steps of manufacturing a MOSFET having a silicide type elevated source/drain structure, in which diffusion of Co atoms into the substrate is suppressed and the contact resistances between the silicide layers and the source/drain regions are also suppressed because a channel current is made to flow into the silicide layer both from the upper and lower interfaces.

Firstly, a structure as shown in FIG. 4C is prepared by following the steps described above for the first embodiment.

Figure 5A:
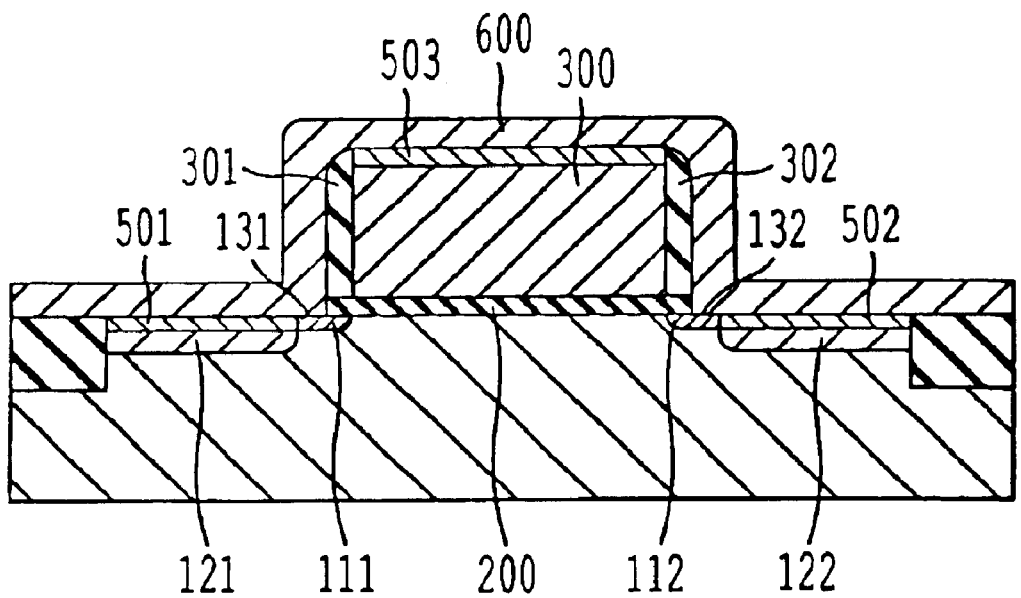
FIGS. 5A through 5D are schematic cross sectional view of the second embodiment of the invention, which is also a MOSFET, in different manufacturing steps.

Then, as shown in FIG. 5A, the of gate sidewalls 301, 302 are partially removed by immersing them into a heated phosphoric acid solution and etching the exterior surface of the sidewalls isotropically and selectively to the silicon substrate 100 and the CoSi regions 501, 503, 502. The gate sidewalls recede and a gate insulation film is exposed thereunder. The exposed underlying gate insulating film 200 is then removed by RIE or by wet etching with an HF solution for a short period of time. As a result, areas 131, 132 adjacent to the gate sidewalls 301, 302 are exposed in the extended source/drain regions 111, 112.

Next, an amorphous silicon layer 600 is deposited with a thickness more than that of Si consumption expected for the ensuing phase transition from CoSi to $CoSi_2$. A gas such as $PH_3$, $AsH_3$ or $B_2H_6$ will be added to $SiH_4$ gas in order to make the amorphous silicon layer 600 conductive to the same conduction type of the source/drain. It should be noted here that, because the amorphous silicon layer 600 is also deposited on the exposed surface of the areas 131, 132, the amorphous silicon 600 retains electrical contacts on source/drain extension regions 111, 112.

Figure 5B:
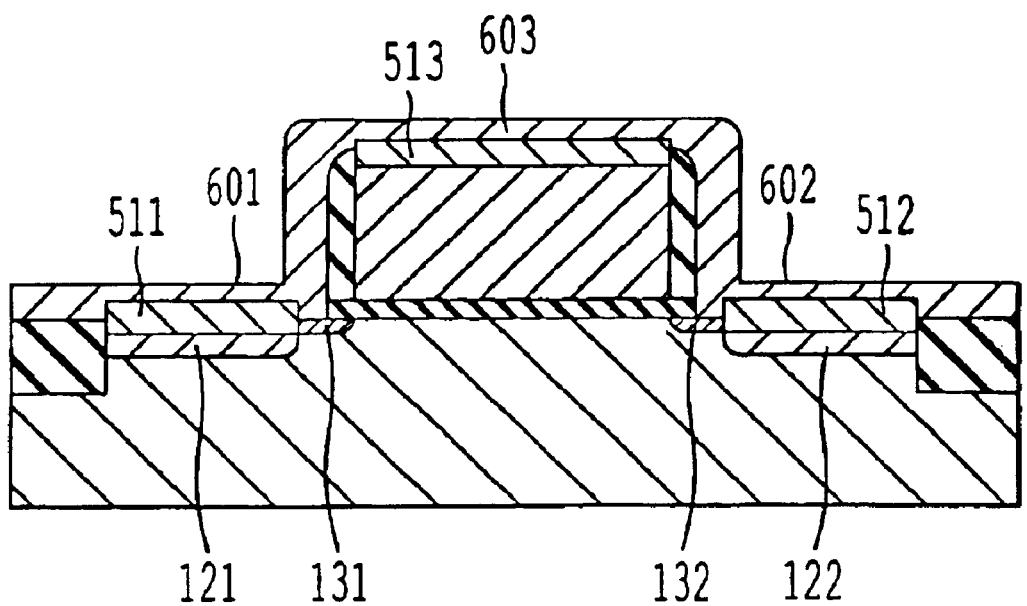

Then, as shown in FIG. 5B, the substrate is subjected to a rapid thermal annealing process at 600° C. for 30 seconds typically in a nitrogen atmosphere so as to cause phase transition from CoSi to $CoSi_2$. The phase transition proceeds selectively only in areas where the amorphous silicon layer 600 is in the direct contact with the CoSi regions 501, 503, 502. As a result of the heat treatment, the phase transition from CoSi to $CoSi_2$ proceeds in such a way that $CoSi_2$ grows only into the amorphous silicon layer 600. $CoSi_2$ regions 511, 513, 512 are formed on the source region 121, the gate electrode 300 and the drain region 122, respectively. And upper portions 601, 603, 602 of the amorphous silicon layer 600 remain on the $CoSi_2$ regions 511, 513, 512.

Figure 5C:
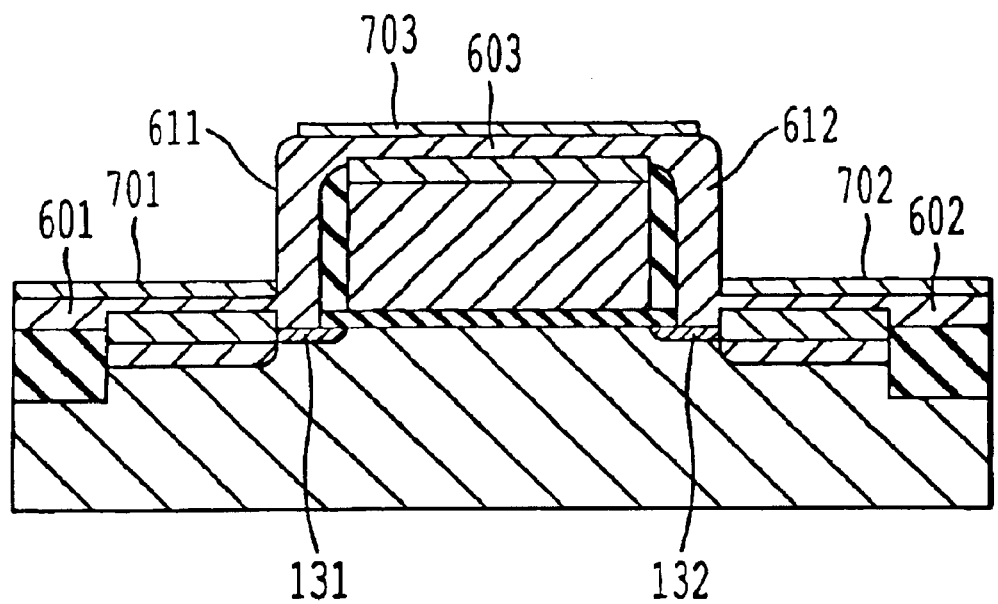

Thereafter, as shown in FIG. 5C, the structure is exposed to a carbon-containing plasma in order to selectively introduce carbon into horizontal parts of the silicon layer 600 including 601, 603, 602. A carbon-containing plasma can be produced by means of any appropriate known technique. Any appropriate carbon supply source can be used for the purpose of the invention. For example, carbon-containing plasma can be generated by supplying $CF_4$, $CHF_3$, CCl or $CH_4$ gas into the plasma. Generally, plasma has a positive electric potential relative to surrounding substances so as to maintain its plasma state. As a result, an electric field is generated in such a way that positively charged particles are accelerated towards the surrounding substances. Thus, positively charged carbon particles in the plasma come to impinge perpendicularly to the horizontal surface of 601, 603, 602, whereas no carbon particles are injected into the vertical surfaces of 611, 612 shown in FIG. 5C. In ordinary RIE plasma, an acceleration voltage is less than 1 KV. Therefore, the carbon incorporation is limited to very surface of the horizontal silicon layers about several nanometers thick. The concentration of the incorporated carbon will exceed 1 atom %.

Figure 5D:
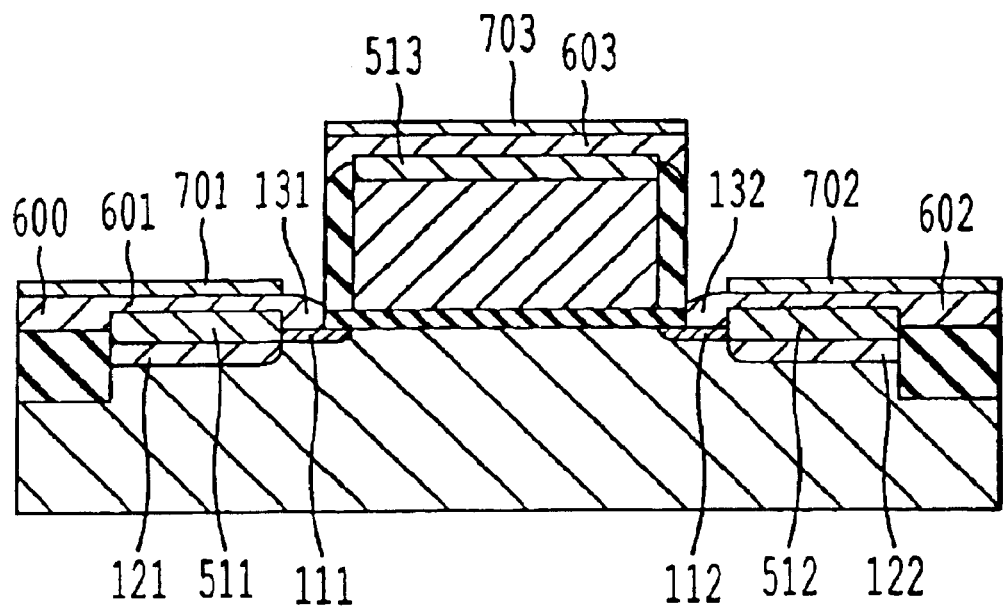
Figure 6:
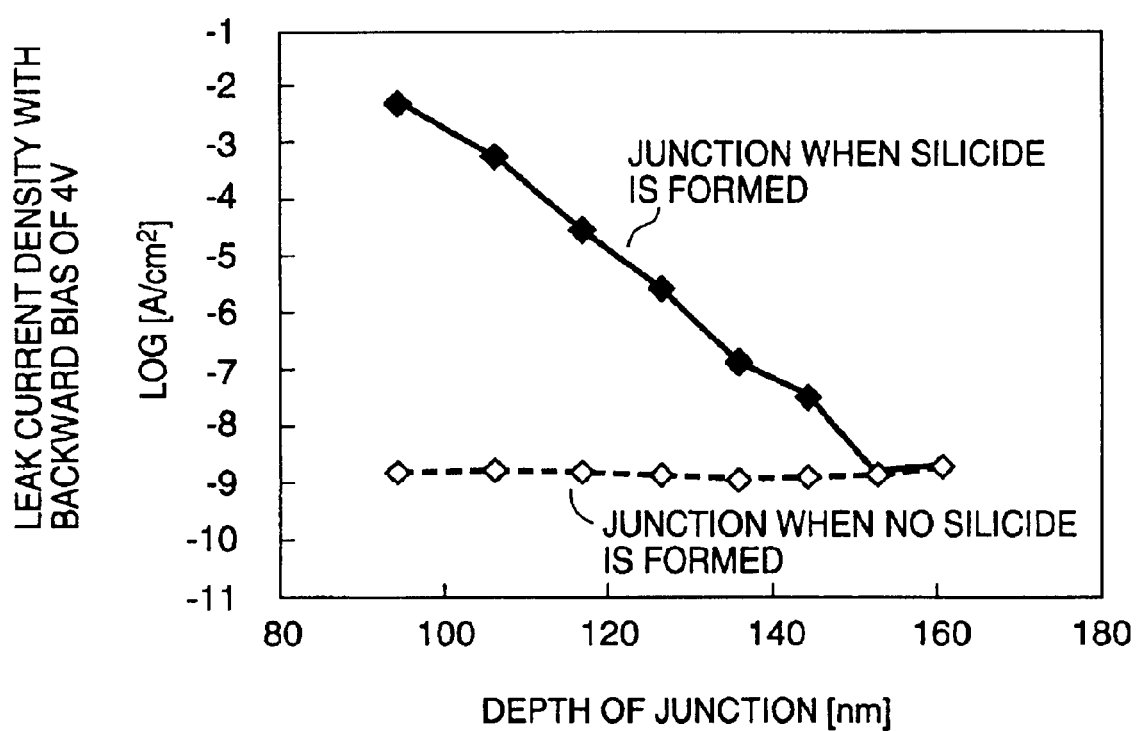
FIG. 6 shows a graph illustrating leakage levels of n+/p junctions with 35 nm-thick $CoSi_2$ layer thereon as a function of the junction depth (the depth includes the 35 nm of the silicide layer thickness). For reference, leakage levels of silicide-less junctions are also plotted.

Next, as shown in FIG. 5D, the carbon-containing silicon surface layers are thermally oxidized and then dipped into a dilute HF solution of 200:1. As disclosed in U.S. Pat. No. 6,271,566, the oxide formed on the carbon-containing silicon surface layers are resistive against HF etching while oxide films formed on carbon-free silicon surfaces are readily etched off by the dipping. Thus, after the wet etching, oxide films 701, 702, 703 remain only on the horizontal planes 601, 602, 603 of the silicon layer whereas silicon on the vertical surfaces 611, 612 is exposed.

Subsequently, the exposed vertical silicon parts 611, 612 are selectively removed by a known effective method such as CDE, using the oxide films 701, 702, 703 on the horizontal planes as an etching mask. As a result, a structure where the silicon layers 601, 602, 603 remain respectively on the $CoSi_2$ regions 511, 512, 513 is produced. It should be particularly noted that, since the silicon layers 601, 602 have electrical contacts to the source/drain extension regions 111, 112 at the areas 131, 132, a channel current can flow into and from the $CoSi_2$ regions 511, 512 through both of the upper and lower interfaces. Therefore, an effective contact resistance of the $CoSi_2$ regions to the source/drain regions can be reduced almost to a half of that of conventional devices. Subsequently, the silicon layer 600 on the device isolating regions is removed by means of an appropriate known technique such as lithography and RIE. If necessary, parts of the silicon layer 600 can be left on the isolation regions so as to be used as local interconnections.

The manufacturing process is completed when interlayer insulating films and contacts connected respectively to the electrodes through the interlayer insulating films are formed and other wiring and mounting operations are finished.

Thus, a MOSFET with SALICIDE structure is realized. It has very shallow source/drain diffusion layers 121, 122, whereas the leakage from the junctions is strongly suppressed. The leakage suppression is attained by tailoring the phase transition to proceed only upward, and therefore preventing the downward diffusion of metal atoms into the junctions. Moreover, the resulting silicide layers are raised about halfway over the source/drain, providing an effect similar to the one obtained with an elevated source/drain structure. The MOSFET is further equipped with extra silicon over-layers on the silicide layers. Because the over-layers retain direct electrical contacts with the source/drain extension regions, the channel current can flow into the silicide layers through both of the upper and lower interfaces with silicon regions. Therefore, the contact resistances between the silicide layers and the source/drain regions are reduced to a half and the drivability of the MOSFET is enhanced.

While this embodiment is described above in terms of a single MOSFET, the manufacturing method according to the present invention can apply to a plurality of devices, a group of devices that constitute part of a semiconductor circuit or to a MOSFET showing a different conduction type.

Additionally, the metal silicide that can be used for the purpose of the invention is not limited to cobalt silicide. The present invention could be effective for silicidation of the source/drain regions by using a metal substance that can form at least two silicide phases showing different composition ratios at different respective temperatures. If the phase transition from the first silicide phase formed at relatively low temperature to the second silicide phase at relatively high temperature takes place preferentially in amorphous silicon compared to crystallized silicon, the present invention is also applicable to the silicidation with this metal. Examples of metal substances that can be used for the purpose of the invention include Co, Ni, composite materials of such metals and composite metals thereof formed by using Ti.

As the second heat treatment is conducted in such a way that the reaction of phase transition proceeds selectively only between an upper amorphous silicon layer and the underlying CoSi layers, Co atoms does not diffuse downward into the single crystal silicon substrate. Then, as a matter of course, no metal atoms reach the source/drain junction interface formed in the substrate and hence the junction leakage is suppressed.

Moreover, because no reaction proceeds between CoSi layers and the crystal silicon substrate below, no silicon is consumed during the heat treatment and $CoSi_2$ layers grow one-sidedly into the upper amorphous silicon layer. Therefore, the $CoSi_2$ layers come to be raised partly over the original surface (the channel forming surface) of the silicon substrate, providing an effect similar to the one obtained with an elevated source/drain structure. Since $CoSi_2$ layers can be formed with a uniform film thickness and raised over the original surface of the silicon substrate, the distance from the bottom of the CoSi$_2$ layers to the source/drain junctions increases. The increased distance strongly suppresses possible junction leakage even further together with the above-explained restrained diffusion of Co atoms.

Additionally, by forming CoSi layers in a self-aligning manner, depositing an amorphous silicon layer thereon and conducting the second heat treatment in this way, the CoSi$_2$ layers can be obtained also in a self-aligning manner over the source region, the drain region and the gate electrode.

Consequently, by removing the remaining amorphous silicon layer, it is now possible to obtain a SALICIDE type MOSFET having an elevated source/drain structure, where diffusion of Co atoms into the substrate is suppressed in a self-aligning manner.

Otherwise, by keeping the remaining amorphous layer in a way that it maintains an electrical contact with extended source/drain region, a channel current can be made to flow from/into the silicide layer through both of the upper and lower interfaces. Then, the contact resistance between the CoSi$_2$ layers and the source/drain regions can be reduced to about a half.

Furthermore, with a manufacturing method according to the invention, the depth of the extended source/drain regions can be determined freely without concerns over the leakage current that may otherwise occur due to the silicidation. It provides an extra latitude in the device designing to prevent the short channel effect and enhance the controllability of the threshold voltage.

Besides, the length of the gate sidewalls (and hence the length of the extended source/drain regions) can be held to 100 nm or less so as to improve the device drivability because the leakage-free nature of the present manufacturing method removes a requirement for thick sidewalls to prevent the leakage induced by the silicidation.

In terms of the gate electrode, since metal atoms are prevented from diffusing into the polycrystalline silicon of the gate electrode, they no longer reach and degrade the gate insulator below. Therefore, the height of the gate electrode can be minimized to a great advantage to the subsequent lithography and planarization steps.

Adding to the above benefits, since the CoSi$_2$ layers grow freely into the upper amorphous silicon layer, any volumetric change induced by the silicidation and consequent generation of mechanical stress can be effectively avoided to eliminate any additional cause of producing leakage from the junction.

Thus, according to the present invention, there are provided a semiconductor device that is free from the previously identified problems of conventional ones. The device has a SALICIDE structure with low leakage currents, while maintaining shallow source and drain regions. Also a method of manufacturing such a semiconductor device is provided.

What is claimed is:

1. A method of manufacturing a semiconductor device, the method comprising the steps of:

forming a gate insulating film on a single crystal silicon layer;

forming a gate electrode on said gate insulating film;

forming a source region and a drain region in said single crystal silicon layer, said source region and said drain region being separated from each other by at least a width of said gate insulating film;

forming extension layers of said source region and said drain region, said extension layers extending under said gate insulating film, being shallower than said source region and said drain region, and being of the same conductivity type as said source region and said drain region;

forming a cobalt silicide layer having a first compound phase on said source region, said drain region, and said gate electrode;

forming an amorphous silicon layer on said first cobalt silicide layers, said amorphous silicon layer being adapted to react with said first cobalt silicide layer; and forming a second cobalt silicide layer having a second compound phase by reacting said amorphous silicon layer and said first cobalt silicide layer at a temperature above which a phase transition reaction occurs between said first cobalt silicide layer and said amorphous silicon layer and below which a phase transition occurs between said first cobalt silicide layer and said single crystal silicon layer, wherein concentrations of cobalt atoms in said source region and said drain region are not higher than $1 \times 10^{19}$ cm$^{-3}$ after formation of the second cobalt silicide layer.

2. The method according to claim 1, wherein the temperature is between 550° C. and 650° C.

3. The method according to claim 1, wherein not less than 17/35 of the film thickness of said second cobalt silicide layer is located over the surface of said single crystal silicon layer.

4. The method according to claim 1, wherein a depth of a pn junction formed by said single crystal silicon layer and either or said source region or said drain region is not greater than 100 nm.

5. The method according to claim 1, wherein said first cobalt silicide layer is CoSi and said second cobalt silicide layer is CoSi$_2$.

6. The method according to claim 1, wherein an unreacted part of said amorphous silicon layer is removed by an isotropic etching.

7. The method according to claim 1, wherein an unreacted part of said amorphous silicon layer is used as part of an electrical interconnection between different semiconductor devices.

* * * * *